US009086721B2

(12) United States Patent
Jackson et al.

(10) Patent No.: US 9,086,721 B2
(45) Date of Patent: Jul. 21, 2015

(54) ALLOCATING RESOURCES TO THREADS BASED ON SPECULATION METRIC

(71) Applicant: IMAGINATION TECHNOLOGIES, LTD., Kings Langley (GB)

(72) Inventors: Hugh Jackson, St. Albans (GB); Paul Rowland, St. Albans (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 14/157,764

(22) Filed: Jan. 17, 2014

(65) Prior Publication Data

US 2014/0218224 A1 Aug. 7, 2014

(30) Foreign Application Priority Data

Jan. 21, 2013 (GB) .................................. 1301041.8

(51) Int. Cl.
*H03M 1/34* (2006.01)
*G06F 9/00* (2006.01)
*G06F 9/38* (2006.01)
*H03M 1/00* (2006.01)
*G06F 9/48* (2006.01)

(52) U.S. Cl.
CPC ................ *G06F 9/00* (2013.01); *G06F 9/3836* (2013.01); *G06F 9/3851* (2013.01); *G06F 9/4881* (2013.01); *H03M 1/00* (2013.01)

(58) Field of Classification Search
CPC ......... H03M 1/00; H03M 1/12; G06F 9/3851; G06F 9/3836; G06F 9/4881
USPC .......... 341/118, 164, 120, 155; 712/228, 218; 718/102
See application file for complete search history.

(56) References Cited

U.S. PATENT DOCUMENTS

| 5,740,417 | A | 4/1998 | Kennedy |
| 2004/0003215 | A1 | 1/2004 | Krimer et al. |
| 2005/0060518 | A1 | 3/2005 | Augsburg et al. |
| 2005/0235170 | A1 | 10/2005 | Atkinson |
| 2006/0161762 | A1 | 7/2006 | Eisen et al. |
| 2009/0150657 | A1 | 6/2009 | Gschwind et al. |
| 2010/0161948 | A1* | 6/2010 | Abdallah ...................... 712/228 |
| 2014/0218222 | A1* | 8/2014 | Yamagata et al. ............ 341/118 |

OTHER PUBLICATIONS

Combined Search and Examination Report Under Sections 17 and 18(3) dated on Aug. 7, 2013 as cited in Application No. 1301041.8 (8pgs).

* cited by examiner

*Primary Examiner* — Joseph Lauture
(74) *Attorney, Agent, or Firm* — Vorys, Sater, Seymour and Pease LLP; Vincent M DeLuca (57) ABSTRACT

Methods, reservation stations and processors for allocating resources to a plurality of threads based on the extent to which the instructions associated with each of the threads are speculative. The method comprises receiving a speculation metric for each thread at a reservation station. Each speculation metric represents the extent to which the instructions associated with a particular thread are speculative. The more speculative an instruction, the more likely the instruction has been incorrectly predicted by a branch predictor. The reservation station then allocates functional unit resources (e.g. pipelines) to the threads based on the speculation metrics and selects a number of instructions from one or more of the threads based on the allocation. The selected instructions are then issued to the functional unit resources.

18 Claims, 5 Drawing Sheets

ALLOCATING RESOURCES TO THREADS BASED ON SPECULATION METRIC

BACKGROUND

There are a number of techniques for increasing throughput in a central processing unit (CPU). One is to increase instruction level parallelism by using a superscalar architecture. This increases the performance of a single thread by allowing more than one instruction from the instruction stream to execute per clock cycle. Another is to increase thread level parallelism by using a multi-core or simultaneous multi-threaded architecture which can allow instructions from more than one thread to operate in parallel.

As the width of a superscalar architecture increases (e.g. the number of instructions that can be executed per clock cycle increases), there are correspondingly more instructions in the pipelines that can affect program flow (e.g. branches) at one time. Moreover, a number of these branches are conditional and it is difficult to know for certain the outcome of these branches until preceding instructions have progressed further down the pipeline. Therefore to maintain increased throughput the outcome of branches are predicted using a speculative technique known as branch prediction. Typically, the wider the superscalar processor, the more speculative the predictions. While correct predictions can dramatically increase the instruction throughput, incorrectly predicted instructions not only do not contribute to the instruction throughput, they tie up valuable resources. For good prediction accuracy, the size of the branch prediction hardware becomes large.

Despite these drawbacks, branch prediction and other speculative techniques are important for good single-threaded throughput in a superscalar processor.

Multithreaded processors typically execute fewer instructions per thread per clock cycle, but across a number of threads can execute multiple instructions (usually known as simultaneous multi-threading). These can maintain a high overall throughput of instructions with lower overall levels of speculation as each thread is not attempting to run as far ahead, i.e. each thread has fewer instructions in progress at any one time.

The embodiments described below are not limited to implementations which solve any or all of the disadvantages of known processors.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are methods, reservation stations and processors for allocating resources to a plurality of threads based on the extent to which the instructions associated with each of the threads are speculative. The method comprises receiving a speculation metric for each thread at a reservation station. Each speculation metric represents the extent to which the instructions associated with a particular thread are speculative. The more speculative an instruction, the more likely the instruction has been incorrectly predicted by a branch predictor. The reservation station then allocates functional unit resources (e.g. pipelines) to the threads based on the speculation metrics; and selects a number of instructions from one or more of the threads based on the allocation. The selected instructions are then issued to the functional unit resources.

A first aspect provides a method of allocating resources between a plurality of threads in a processor, each thread being associated with a plurality of instructions, the method comprising: receiving a plurality of speculation metrics at a reservation station, each speculation metric representing the extent to which the instructions associated with a particular thread are speculative; allocating, at the reservation station, functional unit resources to the plurality of threads based on the speculation metrics; selecting, at the reservation station, instructions associated with the plurality of threads based on the allocation of functional unit resources; and issuing, at the reservation station, the selected instructions to the functional unit resources.

A second aspect provides a reservation station arranged to allocate resources between a plurality of threads, the reservation station comprising: a plurality of instruction queues, each instruction queue configured to store instructions for one of the plurality of threads; and an instruction scheduler in communication with the plurality of instruction queues, the instruction scheduler configured to: receive a plurality of speculation metrics, each speculation metric representing the extent to which the instructions associated with a particular thread are speculative; allocate functional unit resources to the plurality of threads based on the speculation metrics; and select instructions from the plurality of instruction queues based on the allocation of functional unit resources; and issue the selected instructions to the functional unit resources for execution.

A third aspect provides a speculation metric calculator arranged to calculate a plurality of speculation metrics, the speculation metric calculator comprising: an input module configured to receive confidence values for a plurality of instructions, each confidence value representing the likelihood that a particular instruction has been correctly predicted; and a logic unit in communication with the input module, the logic unit configured to generate a plurality of speculation metrics based on the confidence values, each speculation metric representing the extent to which the instructions associated with one of a plurality of threads are speculative.

A fourth aspect provides a processor arranged to allocate functional unit resources between a plurality of threads, comprising: the reservation station of the second aspect; and the speculation metric calculator of the third aspect in communication with the reservation station.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

This acknowledges that firmware and software can be separately used and valuable. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Embodiments described herein combine the superscalar and multi-threading techniques described above to improve parallel processing in a processor. In particular, the processors and methods described herein implement branch prediction and multi-threading where resources are assigned to the threads based on a speculation metric. Each speculation metric represents the extent to which the instructions associated with a particular thread are speculative. The more speculative an instruction, the more likely the instruction has been incorrectly predicted. By allocating resources to threads with less speculative instructions and correspondingly de-allocating resources to threads with more speculative instructions the throughput of the processor may be increased. Specifically, slowing the instruction issue from a thread with a number of speculative instructions may reduce the number of incorrectly predicted instructions in the pipeline which are likely to be re-wound and hence are not an efficient use of resources.

Figure 1:
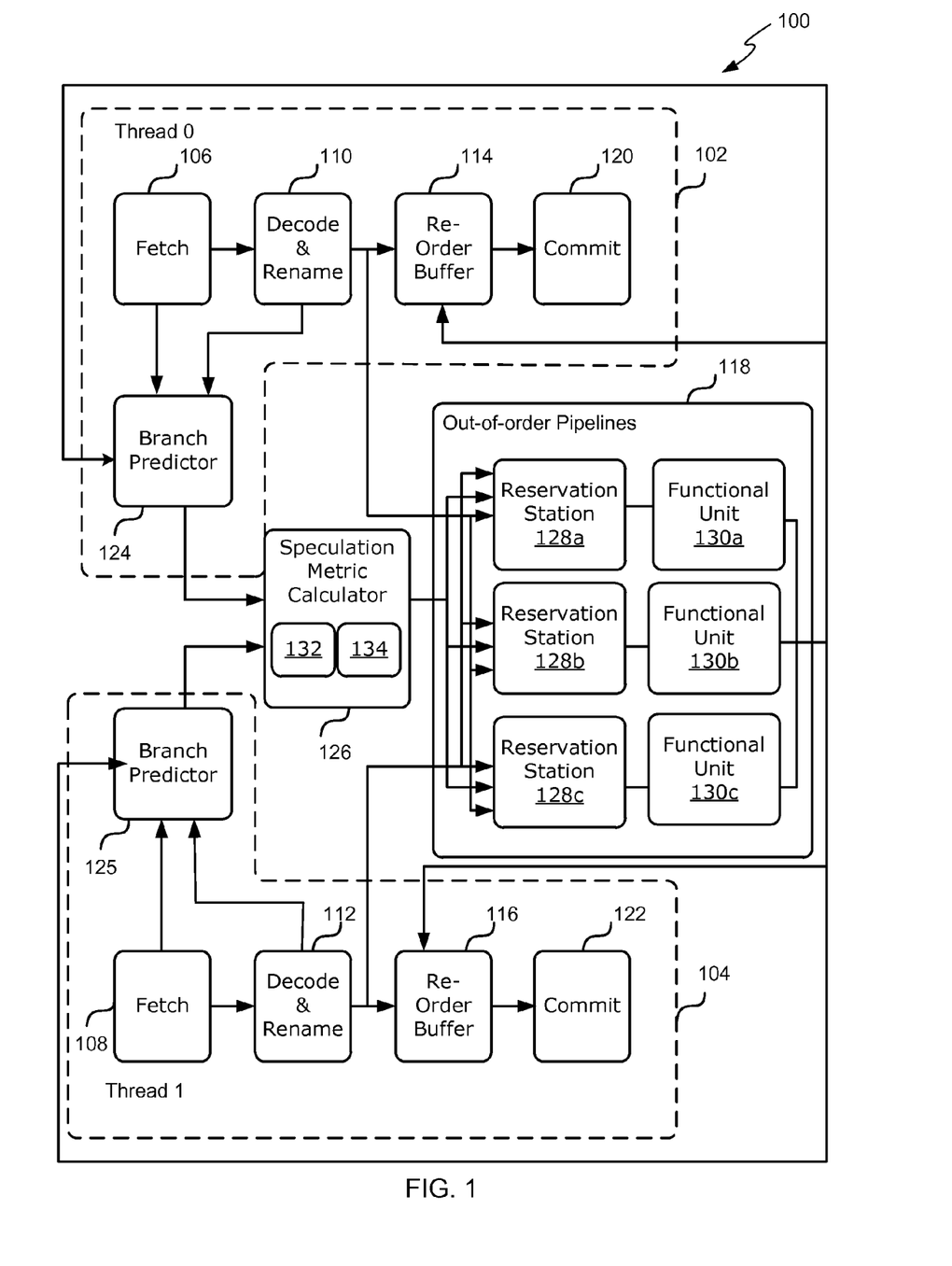
FIG. 1 is a schematic diagram of an example multi-threaded superscalar processor.

Reference is now made to FIG. 1 which illustrates a multi-threaded superscalar processor 100 having two threads 102 and 104 wherein resources are assigned or allocated dynamically to the threads 102 or 104 based on speculation metrics for each thread. Although the example of FIG. 1 shows a multi-threaded superscalar processor with two threads 102 and 104 it will be evident to a person of skill in the art that the methods and principles described herein may equally be applied to processors with more than two threads.

Each thread 102 and 104 comprises a fetch stage 106 or 108 configured to fetch instructions from a program (in program order) as indicated by a program counter (PC) and a decode and renaming stage 110 or 112 arranged to interpret the instructions and perform register renaming. As is known to those of skill in the art register renaming enables more instructions to be executed out-of-order, by removing certain dependencies, such as write-after-read (WAR) dependencies.

After an instruction passes through the renaming stage 110 or 112, it is (a) provided to the plurality of out-of-order pipelines 118 for execution; and (b) inserted into a reorder buffer 114 or 116 (ROB). The re-order buffer 114 or 116 is a buffer that enables the instructions to be executed out-of-order, but committed in-order. The re-order buffer 114 or 116 holds the instructions that are inserted into it in program order, but the instructions within the ROB 114 or 116 can be executed out of sequence by the out-of-order pipelines 118. Instructions are output from the re-order buffer 114 or 116 to a commit stage 120 or 122 in program order after they have been executed by the out-of-order pipelines 118. The commit stage 120 or 122 then commits the results of the instruction to the register/memory.

In some examples, the re-order buffer 114 or 116 can be formed as a circular buffer having a head pointing to the oldest instruction in the ROB 114 or 116, and a tail pointing to the youngest instruction in the ROB 114 or 116. In these examples, instructions are output from the head of the ROB 114 or 116 when that instruction has been executed by the out-of-order pipelines 118, and the head is increment to the next instruction in the ROB.

Each thread 102 and 104 also comprises a branch predictor 124 or 125, which is configured to predict which direction the program flow will take in the case of instructions known to cause possible flow changes, such as a branch instruction. Branch prediction is useful as it enables instructions to be speculatively executed by the processor 100 before the outcome of the branch instruction is known. Each branch predictor 124 or 125 may be in communication with the corresponding fetch stage 106 or 108, decode and renaming stage 110 or 112, and/or the out-of-order pipelines 118. For example, the fetch stages 106 and 108 may use information from the corresponding branch predictor 124 or 125 to determine which instruction to fetch next; the decode and renaming stages 110 and 112 may provide information to the branch predictor 124 or 125 indicating which instructions are branch instructions (in other cases the instructions may be decoded in the fetch stage 106 or 108); and the out-of-order pipelines 118 may provide the branch predictors 124 and 125 with information indicating updates to the program counter.

In some cases, in addition to predicting the direction the program will take, the branch predictor 124 or 125 may also generate a confidence value for each prediction. The confidence value indicates the likeliness of the prediction being correct. In some cases the higher the confidence value the more likely the prediction is correct, and the lower the confidence value the more likely the prediction is incorrect. The confidence values may be in any suitable form. For example, the confidence value may be an integer or percentage implemented as one or more bits. Where only a single bit is used for each confidence value a "0" may indicate no confidence or 0% confidence and a "1" may indicate confidence or 100% confidence. The more bits that are used, the more different confidence values can be assigned.

The confidence value may be determined using any suitable method or technique. For example, in some cases the confidence value for a particular branch prediction is calculated using a two-bit saturating counter. Each time the branch is taken, the associated counter may be incremented. Similarly, when the branch is not taken the counter may be decremented. If at any time the counter has a low value (e.g. 0 or 1) the branch is likely not taken and if the counter has a high value (e.g. 2 or 3) then the branch is likely to be taken. In this technique confidence in a prediction is increased when a branch goes the same way (e.g. taken or not taken) multiple times. Therefore the extreme values (e.g. 0 and 3) may indicate a high confidence and mid values (e.g. 1 or 2) may indicate a low confidence. Other techniques that may be used to generate confidence values are described in the paper "Confidence Estimation by Speculation Control" by Grunwald et al. as published in ISCA '98 Proceedings of the 25th annual international symposium on Computer architecture, Pages 122-131.

The processor 100 may also comprise a speculation metric calculator 126, configured to generate a speculation metric for each thread based on the confidence values of the branch predictions associated with the thread. The speculation metric represents the extent to which the instructions associated with the thread are speculative. The more speculative an instruction is the more likely that the incorrect prediction has been made for the instruction. Conversely, the less speculative an instruction is the more likely the correct prediction has been made for the instruction.

In some cases, the speculation metric calculator 126 may be configured to calculate the speculation metric for a particular thread by summing or otherwise combining the confidence values for a predetermined number of instructions associated with that thread.

In other cases, the speculation metric calculator 126 may be configured to track the confidence values of branches as they progress through the processor 100. When a branch is predicted the speculation metric calculator 126 may add the associated confidence value to the speculation metric for the appropriate thread. Once the branch direction is known (i.e. it has been executed) the speculation metric calculator 126 may subtract the associated confidence value from the speculation metric. This may produce a more accurate speculation metric than summing the confidence values, but may be more costly in terms of the hardware required for implementation.

The speculation metrics calculated by the speculation metric calculator 126 are then provided to the out-of-order pipelines 118 where they are used to allocate resources to the threads. For example, in some cases a thread associated with more speculative instructions may be allocated fewer resources than a thread associated with less speculative instructions. This may improve the overall throughput of the processor by reducing the number of wrong-path (or incorrectly predicted) instructions in the pipeline. Specifically, slowing the instruction issue from a thread with a number of speculative instructions may reduce the number of wrong-path (or incorrectly predicted) instructions in the pipeline which are likely to be re-wound and hence are not an efficient use of resources.

In some cases the speculation metric calculator 126 may comprise an input module 132 for receiving the confidence values from the branch predictors 124 and 125 and a logic unit 134 for calculating the speculation metrics based on the received confidence values. The input module 132 and/or the logic unit 134 may be implemented in hardware logic.

As shown in FIG. 1, the out-of-order pipelines 118 may comprise a plurality of reservation stations 128a, 128b and 128c each associated with a functional unit 130a, 130b or 130c. Each functional unit 130a, 130b, and 130c is responsible for executing instructions and may comprise one or more functional unit pipelines. The functional units 130a, 130b, and 130c may be configured to execute specific types of instructions. For example one or more functional units 130a, 130b and 130c may be a load/store unit, an integer unit, a floating point unit (FPU), a digital signal processing (DSP)/single instruction multiple data (SIMD) unit, or a multiply accumulate (MAC) unit. A load/store unit performs load and store memory instructions, an integer unit performs integer instructions, an FPU executes floating point instructions, a DSP/SIMD unit has multiple processing elements that perform the same operation on multiple data points simultaneously, and a MAC unit computes the product of two numbers and adds that product to an accumulator. The functional units and the pipelines therein may have different lengths and/or complexities. For example, a FPU pipeline is typically longer than an integer execution pipeline because it is generally performing more complicated operations.

The reservation stations 128a, 128b and 128c receive instructions from both threads 102 and 104 and allocate functional unit resources (e.g. pipelines) to the threads 102 and 104 based on the speculation metrics calculated by the speculation metric calculator 126. Although FIG. 1 shows a one-to-one relationship between reservations stations 128a, 128b and 128c and functional units 130a, 130b, and 130c, in other cases there may be a one-to-many relationship between the reservation stations 128a, 128b and 128c and the functional units 130a, 130b and 130c. For example, in some cases at least one of the reservation stations 128a, 128b and 128c may be configured to provide instructions to a plurality of functional units 130a, 130b and/or 130c. In other cases, there may be only a single reservation station 128a, 128b or 128c that is configured to provide instructions to all of the functional units 130a, 130b and 130c. An example reservation station 128 and associated functional unit 130 will be described in more detail with reference to FIG. 2.

Figure 2:
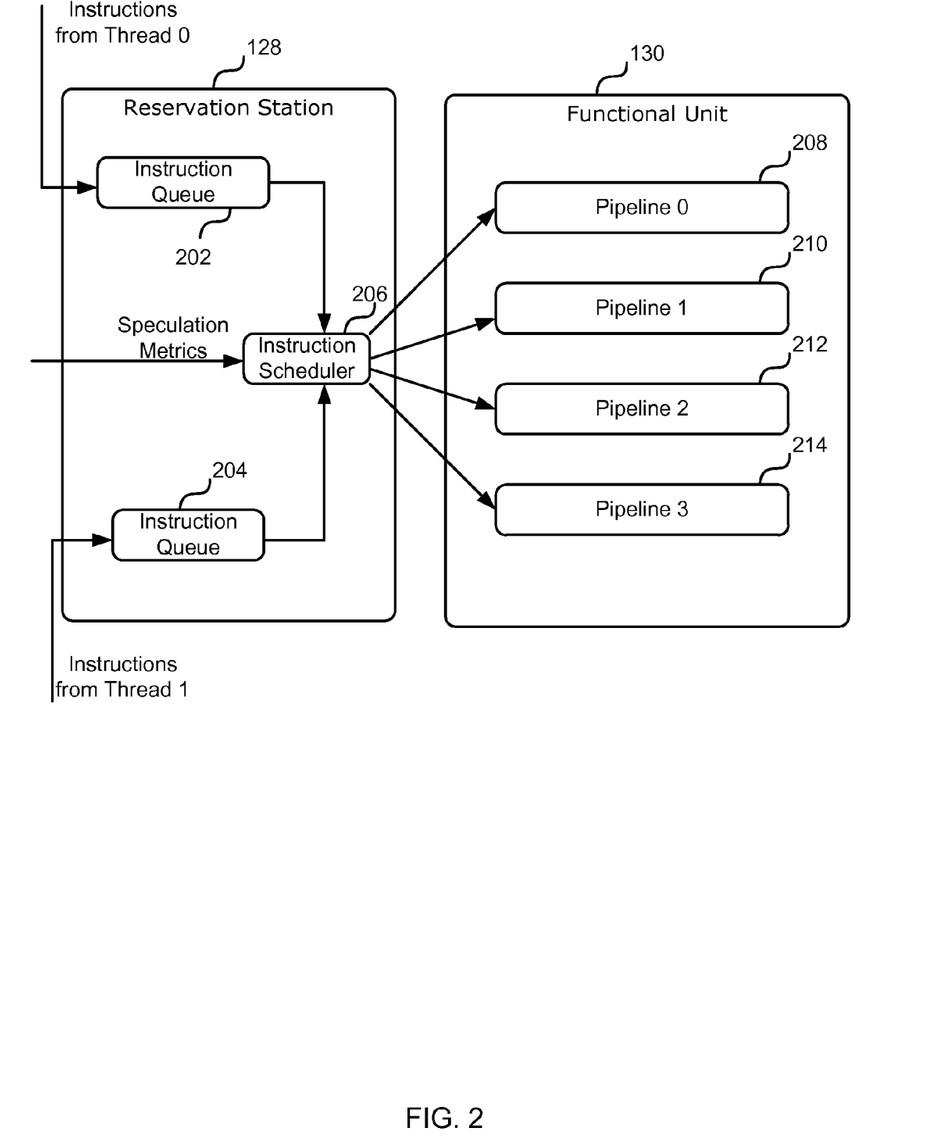
FIG. 2 is a schematic diagram of an example reservation station and associated functional unit of FIG. 1.

Reference is now made to FIG. 2, which illustrates an example reservation station 128 of FIG. 1 and an associated functional unit 130. As described above, the reservation station 128: (a) allocates or assigns functional unit 130 resources (e.g. pipelines) to the threads 102 and 104 based on the speculation metrics calculated by the speculation metric calculator 126; and then (b) issues instructions from the threads to the functional unit 130 resources (e.g. pipelines) based on the allocation.

The exemplary reservation station 128 of FIG. 2 comprises an instruction queue 202 and 204 for each thread in the processor 100. In the processor 100 of FIG. 1, there are two threads 102 and 104 thus the exemplary reservation station 128 has two instruction queues 202 and 204. However, it will be evident to a person of skill in the art that the reservation station 128 may have more or fewer instructions queues depending on the number of threads in the processor.

Each instruction queue 202 and 204 receives instructions from the decode and renaming stage 110 or 112 of a corresponding thread 102 or 104 and stores each instruction in an available entry or slot. An instruction waits in the queue until its input operand values are available. Specifically, the reservation station 128 may monitor the output of the functional unit(s) 130 to find matches for missing operands (operands with a ready bit set to 0) for each instruction in the instruction queues. Once the reservation station 128 finds a match for a missing operand it sets the ready bit for that operand to 1. In some cases, the reservation station 128 also copies the operand from the functional unit 130 output to the instruction queue. In other cases, the operand value is read from the appropriate register file after the instruction has been issued to the functional unit 130. For example, the first stage of the pipelines 208, 210, 212 or 214 may be configured to read the operand value from the appropriate register file. This may reduce the number of connections between the functional unit(s) 130 and the reservation station 128 over the cases where the operand values are copied from the functional unit 130 output.

Once all of an instruction's operand values are available the instruction is said to be ready for execution and a ready bit for that instruction may be set indicating that the instruction is ready to be issued to the functional unit 130. An instruction's operand values may be available before earlier, older instructions allowing it to leave the queue before those earlier, older instructions.

The exemplary reservation station 128 of FIG. 2 also comprises an instruction scheduler 206 configured to issue instructions from the instruction queues 202 and 204 to the functional unit 130 for execution.

The functional unit 130 comprises one or more like pipelines 208, 210, 212 and 214 for executing instructions. The exemplary functional unit 130 of FIG. 2 comprises four pipelines 208, 210, 212 and 214; however, it will be evident to a person of skill in the art that the functional unit 130 may comprise more or fewer pipelines.

Each clock cycle the instruction scheduler 206 attempts to provide each pipeline 208, 210, 212 and 214 with an instruction from one of the instruction queues 202 and 204. In traditional superscalar, multi-threaded processors threads are allocated resources based on simple metrics (e.g. each thread may be allocated an equal number of pipelines; or the threads may be allocated pipelines based on thread performance). For example, if there are two threads and four pipelines (such as the example shown in FIG. 2) each thread may be automatically allocated two pipelines. This means that the instruction scheduler 206 attempts to select two ready instructions from the first instruction queue 202 and two ready instructions from the second instruction queue 204 and then issue the selected instructions to the pipelines 208, 210, 212 and 214.

If however, there are not two ready instructions in a particular instruction queue 202 or 204, then the instruction scheduler 206 may select ready instructions from the other queue so that each pipeline is issued an instruction. As described above, an instruction is said to be ready when all of the instruction's operand values are available.

The ready instructions may be prioritized. For example, they may be prioritized in program order or length of time in the reservation station. Typically the highest priority instruction(s) are selected for issue first.

In the example shown in FIGS. 1 and 2 instead of simply allocating functional unit resources equally between the threads 102 and 104, the instruction scheduler 206 uses the speculation metrics calculated by the speculation metric calculator 126 to allocate the functional unit 130 resources (e.g. pipelines 208, 210, 212 and 214) to the different threads 102 and 104.

In some cases the instruction scheduler 206 is configured to allocate functional unit 130 resources (e.g. pipelines 208, 210, 212 and 214) based on a comparison of the speculation metrics. For example, the instruction scheduler 206 may be configured to allocate additional functional unit 130 resources (e.g. pipelines 208, 210, 212 and 214) to the thread whose speculation metric indicates the thread is associated with less speculative instructions and to correspondingly de-allocate resources from the thread whose speculation metric indicates the thread is associated with more speculative instructions.

Where a higher speculation metric indicates a thread is associated with less speculative instructions and a lower speculation metric indicates the thread is associated with more speculative instructions, the instruction scheduler 206 may allocate more functional unit 130 resources (e.g. pipelines 208, 210, 212 and 214) to the thread that has the higher speculation metric. For example, the instruction scheduler 206 may allocate three pipelines (e.g. pipelines 208, 210 and 212) to the thread (e.g. thread 0) that has the higher speculation metric and only one pipeline (e.g. pipeline 214) to the thread (e.g. thread 1) that has the lower speculation metric. In this example, on the appropriate clock cycle three ready instructions are selected from the instruction queue (e.g. instruction queue 202) associated with the thread (e.g. thread 0) with the higher speculation metric and only one ready instruction is selected from the instruction queue (e.g. instruction queue 204) associated with the thread (e.g. thread 1) with the lower speculation metric.

In some cases the instruction scheduler 206 may be configured to only allocate additional resources to the thread with the less speculative instructions if the difference between that speculation metric and at least one other speculation metric exceeds a predetermined threshold. This is to ensure that the system is not taking away resources from one thread and giving them to another thread when the speculation metrics indicate similar levels of riskiness or speculation.

In some cases if the difference between two speculation metrics exceeds a first predetermined threshold then the instruction scheduler 206 may be configured to de-allocate one of the functional unit 130 resource (e.g. pipelines 208, 210, 212 or 214) from the thread associated with the lower speculation metric and re-allocate that functional unit 130 resource (e.g. pipeline 208, 210, 212 or 214) to the thread associated with the higher speculation metric. In some cases, if the difference between two speculation metrics exceeds a second predetermined threshold then the instruction scheduler 206 may be configured to de-allocate all of the functional unit 130 resources (e.g. pipelines 208, 210, 212 or 214) allocated to the thread with the lower speculation metric and re-allocate those functional unit 130 resources (e.g. pipelines 208, 210, 212 or 214) to the thread with the higher speculation metric.

In some cases, the instruction scheduler 206 may be further configured to take into account the actual speculation metrics in determining whether to re-allocate resources from one thread to another. For example, if a first thread has a speculation metric of 0 and a second thread has a speculation metric of 2, the instruction scheduler 206 may not re-allocate resources between the two threads even though the difference is greater than the predetermined threshold (e.g. 1) since both threads have speculation metrics that indicate that the instructions associated therewith are highly speculative. Conversely, if a first thread has a speculation metric of 6 and a second thread has a speculation of 8, the instruction scheduler 206 may re-allocate resources between the two threads since the difference is greater than the predetermined threshold (e.g. 1) and a speculation metric of 8 indicates that the instructions associated with the second thread are not very risky or speculative.

In some cases, the instruction scheduler 206 may be configured to perform the speculation metric-based allocation each clock cycle. However, it takes a lot of power to perform the allocation each clock cycle. Accordingly, to save power, in some cases, the instruction scheduler 206 may be configured to perform the speculation metric-based allocation periodically (e.g. every 4, 8 or 16 clock cycles). Since instructions are still issued to the pipelines 208, 210, 212 and 214 each cycle, in cycles where the allocation is not performed, the instruction scheduler 206 may be configured to use the most recently computed allocation to issue instructions. The use of the most recently computed allocation does not, however, prevent the instruction scheduler 206 from issuing more instructions from a particular thread than specified in the allocation in cases where another thread cannot use all of its allocated resources (e.g. pipelines). Specifically, if a thread does not have enough ready instructions to use all of its allocated resources (e.g. pipelines), then the instruction scheduler 206 may select additional ready instructions from another thread to use the resources (e.g. pipelines).

In some cases, the software programmer may have the ability to select an acceptable risk level for each thread. Specifically the software programmer may have the ability to set an acceptable speculation metric for each thread. This may be useful where a particular program may look risky (e.g. highly speculative), but the predictions are often correct for the particular program. In these cases, only if the speculation metric for the thread indicates that the risk is higher than the acceptable risk will resources be reallocated to another thread, otherwise the resources will be divided according to a default allocation. The default allocation may be configurable by the software programmer or hard coded. In some cases the default allocation is set so that each thread is allocated an equal number of resources. For example, where a lower speculation metric indicates a more risky or speculative thread and a higher speculation metric indicates a less risky or speculative thread, the instruction scheduler 206 may be configured to de-allocate resources from a thread if the speculation metric for that thread is below the acceptable speculation metric set by the programmer.

Since each pipeline 208, 210, 212 and 214 can end up with instructions from more than one thread, when the instruction scheduler 206 issues instructions to the pipelines 208, 210, 212 and 214 it may also provide the pipelines 208, 210, 212 and 214 with an indication of which thread the instruction is associated with. Then, if an incorrectly predicted instruction occurs in a pipeline 208, 210, 212 and 214 requiring a rewind of the pipelines 208, 210, 212 and 214, the pipelines 208, 210, 212 and 214 can rewind or flush only those instructions that are associated with the thread with the incorrectly predicted instruction instead of rewinding all instructions. In some cases the incorrectly predicted instruction may be allowed to continue in the pipeline 208, 210, 212 or 214 until all of the instructions up until the incorrectly predicted instruction have been executed. At that point all instructions in the pipelines 208, 210, 212 and 214 and the reservation station 128 from the particular thread have occurred after the incorrectly predicted instruction and need to be rewound or flushed.

In some cases the instruction scheduler 206 may be configured to de-prioritize any thread that has an incorrectly predicted instruction in the pipelines. Once it is known that a thread has an incorrectly predicted instruction in the pipeline it is guaranteed that there are instructions associated with this thread that will have to be flushed from the pipelines. Specifically, any instructions in the pipelines for that thread after the incorrectly predicted instructions will have to be flushed. Accordingly, de-prioritizing any thread that has an incorrectly predicted instruction reduces the number of instructions in the pipelines that will have to be flushed.

Once a thread has been identified as having an incorrectly predicted instruction in the pipeline the thread may be allocated none or a predetermined minimum number of resources (e.g. one pipeline). When a thread is not allocated any resources then instructions from that thread may only be issued to the pipelines if there are not enough instructions from the other threads to satisfy the allocation.

In some cases, the thread with the incorrectly predicted instruction may be allocated resources in a normal manner (e.g. based on the speculation metrics) after a predetermined period of time, after the performance of the thread falls below a predetermined threshold, or after the pipelines have been flushed for that thread.

Figure 3:
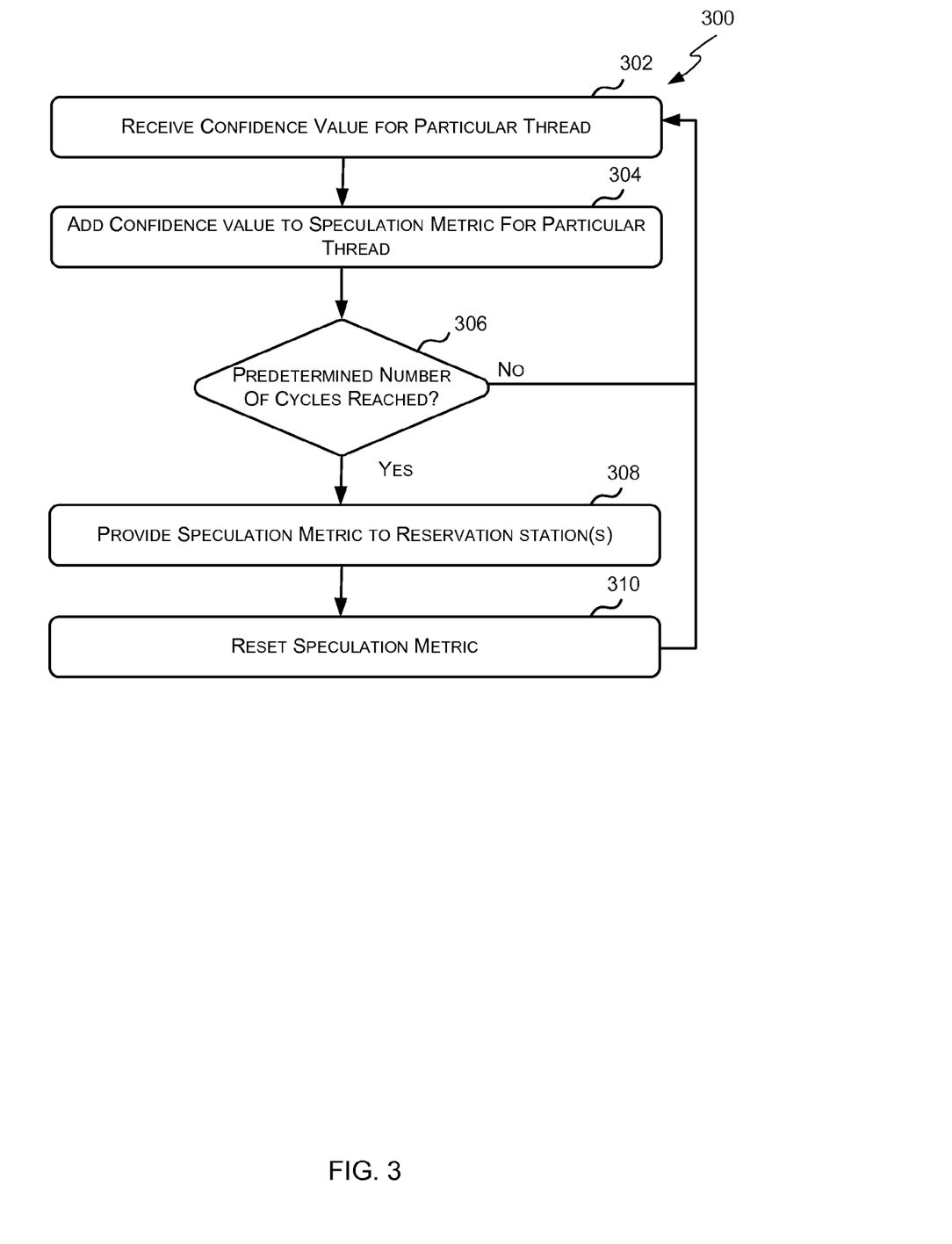
FIG. 3 is a flowchart of an example method for calculating a speculation metric for a thread.

Reference is now made to FIG. 3 which illustrates a method 300, which may be performed by the speculation metric calculator 126 of FIG. 1, for determining the speculation metric for a particular thread. At step 302, the speculation metric calculator 126 receives a confidence value from the branch predictor 124 for a particular branch prediction for a particular thread (e.g. thread 0). As described above, the confidence value represents the likelihood that the prediction is correct. In some cases the higher the confidence value the more likely the prediction is correct and the lower the confidence value the more likely the prediction is incorrect. Once the confidence value has been received the method 300 proceeds to step 304.

At step 304, the speculation metric calculator 126 adds the received confidence value to the speculation metric for the particular thread (e.g. thread 0). Once the confidence value has been added to the speculation metric for the particular thread the method 300 proceeds to step 306.

At step 306, the speculation metric calculator 126 determines whether a predetermined number of cycles (e.g. eight cycles) have been reached. In particular, in some cases the speculation metric for a particular thread is calculated by summing or otherwise combining the confidence values over a predetermined number of cycles. The predetermined number of cycles is selected to be large enough that the system is not allocating or de-allocating resources too quickly (e.g. as soon as a thread has one highly speculative instruction), but is small enough that it will be responsive to general changes in the speculative nature of the instructions associated with a thread. The predetermined number of cycles may be tuned based on experimentation. If the predetermined number of cycles have been reached the method 300 proceeds to step 308. If, however, the predetermined number of cycles have not been reached then the method 300 proceeds back to step 302.

At step 308, the speculation metric calculator 126 provides the speculation metric to the reservation stations 128. At step 310, the speculation metric is reset. Once the speculation metric has been reset, the method 300 proceeds back to step 302.

One instance of method 300 may be run in parallel for each thread in the processor.

While method 300 describes calculating a speculation metric by summing confidence values over a predetermined number of cycles, in other embodiments, instead of resetting the speculation metric after a predetermined number of cycles, the speculation metric calculator 126 may monitor any branches through the processor and subtract the confidence value associated with a particular branch from the speculation metric once it has been executed. In these cases the speculation metric may be periodically sampled and provided to the reservation station to perform the allocation.

Furthermore, while method 300 describes calculating a speculation metric by summing confidence values over a predetermined number of cycles, in other embodiments the speculation metric may be calculated by summing confidence values over a predetermined number of instructions. In these embodiments, the speculation metric calculator 126 may be configured to receive input from another stage or component, such as the fetch stage 106 or 108 that indicates the number of instructions that have been processed.

Figure 4:
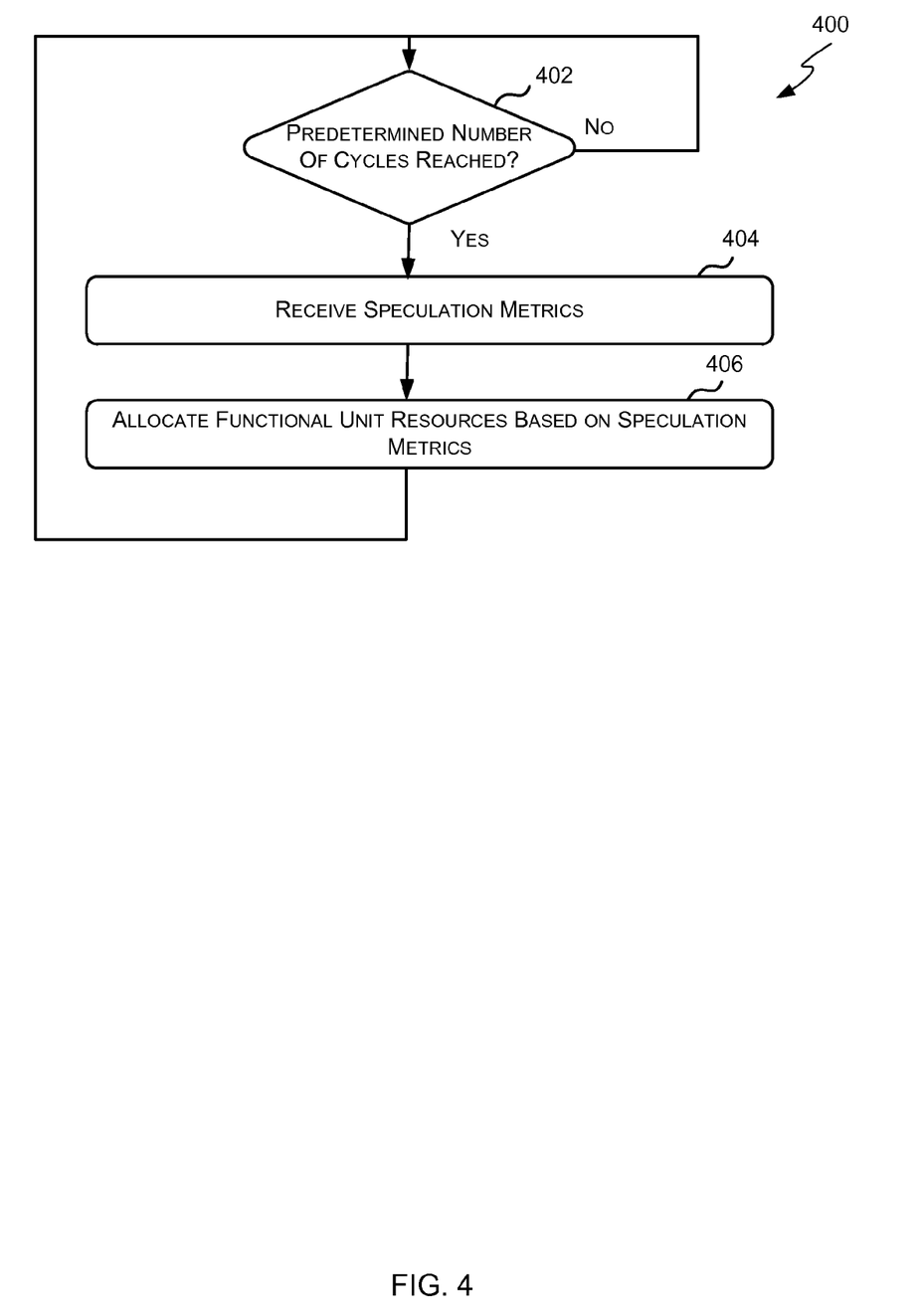
FIG. 4 is a flowchart of an example method for allocating resources between threads based on speculation metrics.

Reference is now made to FIG. 4 which illustrates a method 400, which may be performed by the instruction scheduler 206 of FIG. 2, for allocating resources between a plurality of threads based on the speculation metric associated with the threads. At step 402, the instruction scheduler 206 determines whether a predetermined number of cycles have occurred since the last allocation. If the predetermined number of cycles have occurred then the method proceeds to step 404. If, however, the predetermined number of cycle have not yet occurred then the method proceeds back to step 402.

The predetermined number of cycles determines how often the allocation is performed. For example, if the predetermined number of cycles is set to one then the allocation may be performed each clock cycle. If, however, the predetermined number of cycles is greater than one (e.g. 4, 8, or 16) then the allocation may only be performed periodically.

In some cases the predetermined number of cycles used in method 400 is the same as the predetermined number of cycles used in method 300. This ensures that time and resources are not wasted by the speculation metric calculator 126 and/or the instruction scheduler 206. For example, if the predetermined number of cycles used in method 300 were less than the predetermined number of cycles used in method 400 then the speculation metric calculator 126 may be wasting time and resources calculating speculation metrics that will not be used by the instruction scheduler 206. Similarly, if the predetermined number of cycles used in method 300 were greater than the predetermined number of cycles used in method 400 then the instruction scheduler 206 may be wasting time and resources allocating functional unit resources based on speculation metrics that have not changed since the last allocation.

In the cases where the predetermined number of cycles used in method 400 is the same as the predetermined number of cycles used in method 300, there may be a single counting unit that counts the number of cycles. In some cases, the single counting unit may provide an indication to both the speculation metric calculator 126 and the instruction scheduler 206 when the predetermined number of cycles has been reached. In other cases, the counting unit may provide the indication to the speculation metric calculator 126 which in response provides the speculation metrics to the instruction scheduler 206. In these cases the instruction scheduler 206 may determine that the predetermined number of cycles has been reached when it receives the speculation metrics from the speculation metric calculator 126. In yet other cases, the counting unit may provide the indication to the instruction scheduler 206 which in response requests the speculation metrics from the speculation metric calculator 126. In these cases the speculation metric calculator 126 may determine that the predetermined number of cycles has been reached when it receives the request from the instruction scheduler 206.

At step 404, the instruction scheduler 206 receives and stores the speculation metrics for each thread (e.g. threads 102 and 104) from the speculation metric calculator 126. As described above, in some cases the instruction scheduler 206 pulls the speculation metrics from the speculation metric calculator 126 once the predetermined number of cycles has been reached. In other cases, the speculation metric calculator 126 provides the speculation metrics to the instruction scheduler 206 once the predetermined number of cycles has been reached. Once the instruction scheduler 206 has received the speculation metrics, the method 400 proceeds to step 406.

At step 406, the instruction scheduler 206 allocates functional unit 130 resources (e.g. pipelines 208, 210, 212 and 214) to the threads (e.g. threads 102 and 104) based on the received speculation metrics. In some cases, allocating functional unit 130 resources (e.g. pipelines 208, 210, 212 and 214) to the threads comprises comparing the speculation metrics for the different threads. For example, the instruction scheduler 206 may be configured to allocate additional resources to the thread with the speculation metric indicating a less speculative set of instructions and correspondingly de-allocate resources allocated to the thread with the speculation metric indicating a more speculative set of instructions. In cases where a higher speculation metric indicates a less risky or speculative set of instructions and a lower speculation metric indicates a more risky or speculative set of instructions the instruction scheduler 206 may be configured to allocate additional resources to the thread associated with the higher speculation metric and correspondingly de-allocate resources allocated to the thread with the lower speculation metric.

For example, where there are four pipelines (e.g. pipelines 208, 210, 212 and 214) and two threads (e.g. thread 0 and thread 1) as shown in FIG. 2, each thread may initially be allocated two pipelines. After receiving the speculation metrics for the threads the instruction scheduler may increase the resources allocated to the thread (e.g. thread 0) with the higher speculation metric so that it is allocated three pipelines and correspondingly decrease the resources allocated to the thread (e.g. thread 1) with the lower speculation metric so that it is allocated only one pipeline.

In other cases, resources are only allocated to the thread with the speculation metric indicating the less speculative set of instructions if the difference between that speculation metric and at least one other speculation metric exceeds a predetermined threshold.

In still other cases, allocating functional unit 130 resources (e.g. pipelines 208, 210, 212 and 212) to the threads comprises comparing the speculation metrics of the threads to acceptable speculation metrics set by the programmer. As described above, the programmer may have the ability to set an acceptable speculation metric level for each of the threads.

In these cases, if the speculation metric for a particular thread falls below the acceptable speculation metric specified for that thread resources (e.g. pipelines 208, 210, 212 and 214) are de-allocated from that thread and re-allocated to another thread. For example, if there are two threads (e.g. thread 0 and thread 1) and four pipelines (e.g. pipelines 208, 210, 212 and 214) as shown in FIG. 2 and each thread is initially assigned two pipelines, if the speculation metric for one of the threads (e.g. thread 1) is below the specified acceptable speculation metric for that thread then the resources allocated to that thread (e.g. thread 1) may be decreased so that thread is only assigned one pipeline, and corresponding the resources allocated to the other thread (e.g. thread 0) may be increased so that it is allocated three pipelines.

In some cases, where the speculation metric for each of the threads is below its associated acceptable speculation metric then the threads may be allocated resources based on a default allocation. In some cases, the default allocation may specify that the resources are to be allocated equally between the threads.

Figure 5:
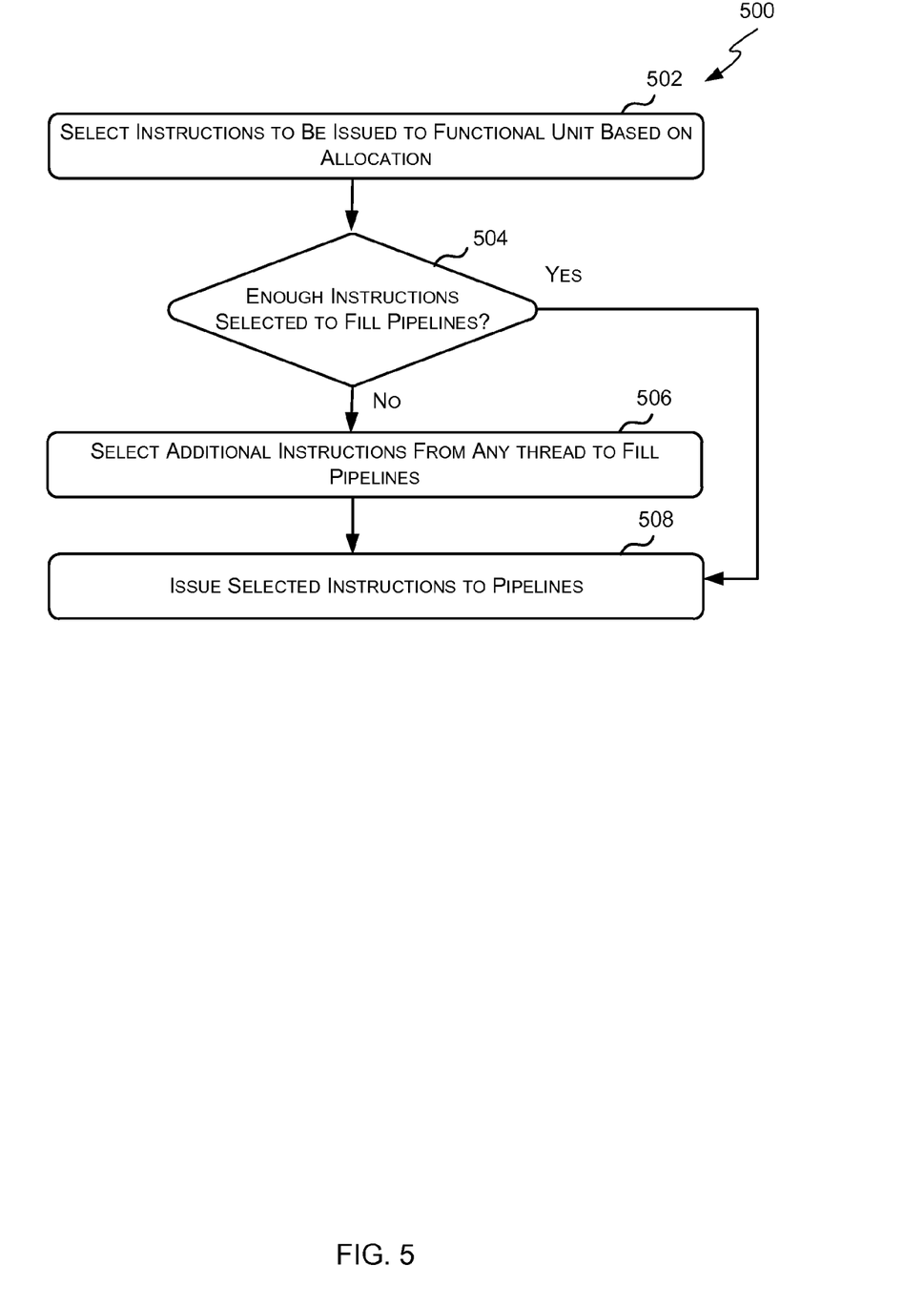
FIG. 5 is a flowchart of an example method for issuing instructions to a functional unit.

Reference is now made to FIG. 5 which illustrates a method 500, which may be performed by the instruction scheduler 206 of FIG. 2, for issuing instructions from a plurality of threads 102 and 104 to a functional unit 130.

At step 502, the instruction scheduler 206 selects instructions from the threads to be issued to the functional unit 130 based on the number of resources allocated to the threads. The allocation may be done, for example, in accordance with method 400. In some cases the number of instructions selected from each thread is based on the number of pipelines allocated to each thread. For example, if one thread is allocated three pipelines and the other thread is allocated one pipeline, then the instruction scheduler 206 may attempt to select three instructions from the thread allocated three pipelines and one instruction from the thread allocated one pipeline. As noted above, an instruction can only be selected for execution if it is ready for execution (i.e. its operand values are available). Therefore it is possible that the instruction scheduler 206 may not be able to select enough ready instructions to fill the pipelines in accordance with the resources allocated to the threads. Accordingly, after the instruction scheduler 206 has selected the instructions to be issued to the functional unit based on the resource allocation the method 500 proceeds to step 504.

At step 504, the instruction scheduler 206 determines whether the instruction scheduler 206 was able to select enough ready instructions in step 502 to fill the pipelines in the corresponding functional unit 130. If it is determined that enough ready instructions were selected in step 502 to fill the pipelines in the corresponding functional unit 130 (e.g. one instruction per pipeline) then the method 500 proceeds directly to step 508. If, however, it is determined that enough ready instructions were not selected in step 502 to fill the pipelines in the corresponding functional unit 130 (e.g. less than one instruction per pipeline) then the method proceeds to step 506.

At step 506, the instruction scheduler 206 attempts to select additional ready instructions from any thread to fill the pipelines. For example, if there are four pipelines and the instruction scheduler 206 was only able to select three ready instructions in step 502 according to the allocation, the instruction scheduler 206 may attempt to select one additional ready instruction from any thread to fill the pipelines. It is possible, however, that there are no more ready instructions from any of the threads. Accordingly, once the selection is complete or it is determined that there are no additional ready instructions, the method 500 proceeds to step 508.

At step 508, the instruction scheduler 206 attempts to issue one selected instruction to each of the pipelines 208, 210, 212 and 214 by writing instruction codes and operand values to the beginning of the pipelines. For example, if there are four pipelines and four instructions were selected from steps 502 and 506 then one selected instruction is issued to each pipeline. If, however, there are four pipelines and only three instructions were selected from steps 502 and 506 then one selected instruction is issued to each of three of the pipelines.

It does not generally matter which instruction is issued to which pipeline. However, in some cases instructions from a particular thread may be issued to the pipelines in a predetermined order. For example, if there are four pipelines numbered 0 to 3 as shown in FIG. 2, any instructions selected from the first thread (e.g. thread 0) may be first issued to the first pipeline (e.g. pipeline 0) and then to subsequent pipelines (e.g. pipeline 1) in ascending order; and any instructions selected from the second thread (e.g. thread 1) may be first issued to the last pipeline (e.g. pipeline 3) and then to subsequent pipelines (e.g. pipeline 2) in descending order. Once the selected instructions have been issued to the pipelines for execution, the method 500 ends.

In some cases method 500 is executed once each clock cycle.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function (s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of allocating resources between a plurality of threads in a processor, each thread being associated with a plurality of instructions, the method comprising:
receiving, at a reservation station, a speculation metric for each thread of the plurality of threads, each speculation metric representing an extent to which the instructions associated with the thread are speculative;
allocating, at the reservation station, functional unit resources to the plurality of threads based on the speculation metrics, comprising:
comparing the speculation metrics to identify a thread with less speculative instructions;
determining a difference between the speculation metric for the thread with less speculative instructions and a speculation metric for another thread; and
in response to determining the difference exceeds a threshold, allocating additional functional unit resources to the thread with less speculative instructions;
selecting, at the reservation station, instructions associated with the plurality of threads based on the allocation of functional unit resources; and
issuing, at the reservation station, the selected instructions to the functional unit resources.

2. The method according to claim 1, further comprising:
receiving at a speculation metric calculator confidence values for the plurality of instructions, each confidence value representing the likelihood that a particular instruction has been correctly predicted;
generating at the speculation metric calculator the speculation metrics based on the confidence values; and
providing the speculation metrics from the speculation metric calculator to the reservation station.

3. The method according to claim 2, wherein generating a speculation metric for a particular thread comprises summing the confidence values for instructions associated with that thread over a predetermined number of cycles.

4. The method according to claim 2, wherein generating a speculation metric for a particular thread comprises adding a generated confidence value associated with a particular instruction associated with that thread to the speculation metric for that thread and subtracting the confidence value from the speculation metric for that thread once the associated instruction has been executed.

5. The method according to claim 1, wherein the allocation of functional unit resources is performed once every clock cycle.

6. The method according to claim 1, wherein the allocation of functional unit resources is performed periodically.

7. The method according to claim 1, wherein the functional unit resources comprise a plurality of pipelines, and allocating functional unit resources to the plurality of threads comprises allocating none, one or more pipelines to each thread.

8. The method according to claim 7, wherein selecting instructions associated with the plurality of threads based on the allocation comprises selecting a number of ready instructions from a particular thread, wherein the number of ready instructions is equal to the number of pipelines allocated to the particular thread.

9. The method according to claim 8, wherein in response to determining the number of instructions selected based on the allocation is less than the number of pipelines, selecting ready instructions from any thread so that the number of selected instructions is equal to the number of pipelines.

10. An apparatus with a reservation station arranged to allocate resources between a plurality of threads, the reservation station comprising:
a plurality of instruction queues, each instruction queue configured to store instructions for one of the plurality of threads; and
an instruction scheduler in communication with the plurality of instruction queues, the instruction scheduler arranged to:
receive a speculation metric for each thread of the plurality of threads, each speculation metric representing an extent to which the instructions associated with the thread are speculative;
allocate functional unit resources to the plurality of threads based on the speculation metrics, comprising:
comparing the speculation metrics to identify a thread with less speculative instructions;
determining a difference between the speculation metric for the thread with less speculative instructions and a speculation metric for another thread; and
in response to determining the difference exceeds a predetermined threshold, allocating additional functional unit resources to the thread with less speculative instructions;
select instructions from the plurality of instruction queues based on the allocation of functional unit resources; and
issue the selected instructions to the functional unit resources for execution.

11. The apparatus according to claim 10, wherein the allocation of functional unit resources is performed once every clock cycle.

12. The apparatus according to claim 10, wherein the allocation of functional unit resources is performed periodically.

13. The apparatus according to claim 10, wherein the functional unit resources comprise a plurality of pipelines, and allocating functional unit resources to the plurality of threads based on the speculation metrics comprises allocating none, one or more of the pipelines to each thread based on the speculation metrics.

14. The apparatus according to claim 13, wherein selecting instructions from the plurality of instruction queues based on the allocation comprises selecting a number of ready instructions from a particular instruction queue, wherein the number of ready instructions is equal to the number of pipelines allocated to the thread associated with the particular instruction queue.

15. The apparatus according to claim 14, wherein in response to determining the number of ready instructions selected based on the allocation is less than the number of pipelines, selecting ready instructions from any instruction queue so that the number of selected instructions is equal to the number of pipelines.

16. An apparatus with a speculation metric calculator arranged to calculate a speculation metric for each of a plurality of threads, the speculation metric calculator comprising:
an input module configured to receive confidence values for a plurality of instructions, each instruction associated with a thread of the plurality of threads, each confidence value representing the likelihood that a particular instruction has been correctly predicted; and a logic unit in communication with the input module, the logic unit configured to generate the speculation metrics based on the confidence values, each speculation metric representing an extent to which instructions associated with the thread are speculative.

17. The apparatus according to claim 16, wherein the logic unit is configured to generate a speculation metric for a particular thread by a process comprising summing the confidence values for instructions associated with that thread over a predetermined number of cycles.

18. The apparatus according to claim 16, wherein the logic unit is configured to generate a speculation metric for a particular thread by a process comprising adding a generated confidence value associated with a particular instruction associated with that thread to the speculation metric for that thread and subtracting the confidence value from the speculation metric for that thread once the associated instruction has been executed.

* * * * *